United States Patent
Chang et al.

(10) Patent No.: US 9,925,888 B2
(45) Date of Patent: Mar. 27, 2018

(54) BATTERY CELL STATE OF CHARGE INITIALIZATION IN A PRESENCE OF VOLTAGE MEASUREMENT UNCERTAINTY

(71) Applicant: FORD GLOBAL TECHNOLOGIES, LLC, Dearborn, MI (US)

(72) Inventors: Xiaoguang Chang, Northville, MI (US); Xu Wang, Northville, MI (US); Chuan He, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 225 days.

(21) Appl. No.: 15/058,471

(22) Filed: Mar. 2, 2016

(65) Prior Publication Data

US 2017/0253140 A1  Sep. 7, 2017

(51) Int. Cl.
*H02J 7/00* (2006.01)
*B60L 11/18* (2006.01)

(52) U.S. Cl.
CPC ....... *B60L 11/1861* (2013.01); *B60L 11/1877* (2013.01)

(58) Field of Classification Search
USPC .......................... 320/108, 109, 112, 118, 119
See application file for complete search history.

(56) References Cited

U.S. PATENT DOCUMENTS

| | | | |
|---|---|---|---|
| 2011/0032047 A1* | 2/2011 | Yuzurihara | H01J 37/32082 332/108 |
| 2013/0013238 A1 | 1/2013 | Kawakita | |
| 2014/0074416 A1 | 3/2014 | Park et al. | |
| 2015/0231982 A1 | 8/2015 | Li et al. | |
| 2016/0048187 A1* | 2/2016 | Zhang | G06F 1/3206 713/330 |

* cited by examiner

*Primary Examiner* — Brian Ngo
(74) *Attorney, Agent, or Firm* — David Kelley; Brooks Kushman P.C.

(57) ABSTRACT

A vehicle includes a traction battery and a controller. The controller is programmed to detect a voltage measurement error associated with a battery cell. The controller is also programmed to, in response to detecting a voltage measurement error for a battery cell, initialize a state of charge of the battery cell according to an average change in stored capacity between power cycles.

19 Claims, 4 Drawing Sheets

BATTERY CELL STATE OF CHARGE INITIALIZATION IN A PRESENCE OF VOLTAGE MEASUREMENT UNCERTAINTY

TECHNICAL FIELD

This application is generally related to estimating a state of charge for a traction battery in a vehicle.

BACKGROUND

Electrified vehicles include hybrid electric vehicles (HEV) and battery electric vehicles (BEV). Electrified vehicles include a traction battery to store energy to be used for propulsion and other purposes. The traction battery is generally operated using various parameters that are defined during the development phase. Over time, operating parameters of the traction battery change causing changes in performance of the traction battery.

SUMMARY

A vehicle includes a battery including a plurality of cells. The vehicle also includes a controller programmed to, in response to a duration between consecutive power cycles being within a predetermined range and an amp-hour change of one of the cells over the duration being a predetermined amount less than an average amp-hour change of the cells over the duration, output a state of charge for the one of the cells based on the average amp-hour change.

A battery management system includes a controller programmed to, in response to a duration between consecutive power cycles being greater than a predetermined duration and an amp-hour change of one of a plurality of battery cells over the duration being a predetermined amount greater than an average amp-hour change of the battery cells over the duration, output a state of charge for the one of the battery cells based on the average amp-hour change.

A method includes outputting by a controller a state of charge for one of a plurality of battery cells based on an average amp-hour change over a duration between power cycles in response to the duration being within a predetermined range and an amp-hour change of one of the battery cells over the duration being a predetermined amount less than the average amp-hour change.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
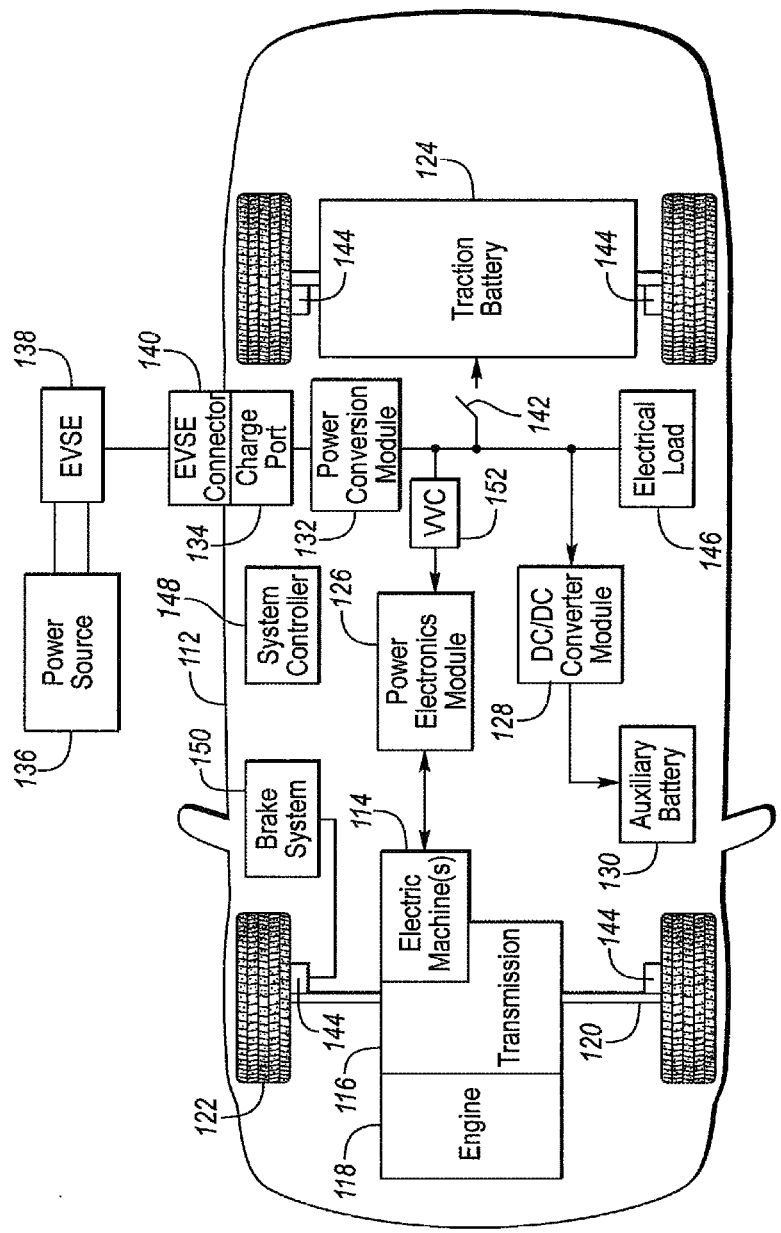
FIG. 1 is a diagram of a hybrid vehicle illustrating typical drivetrain and energy storage components.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114.

Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
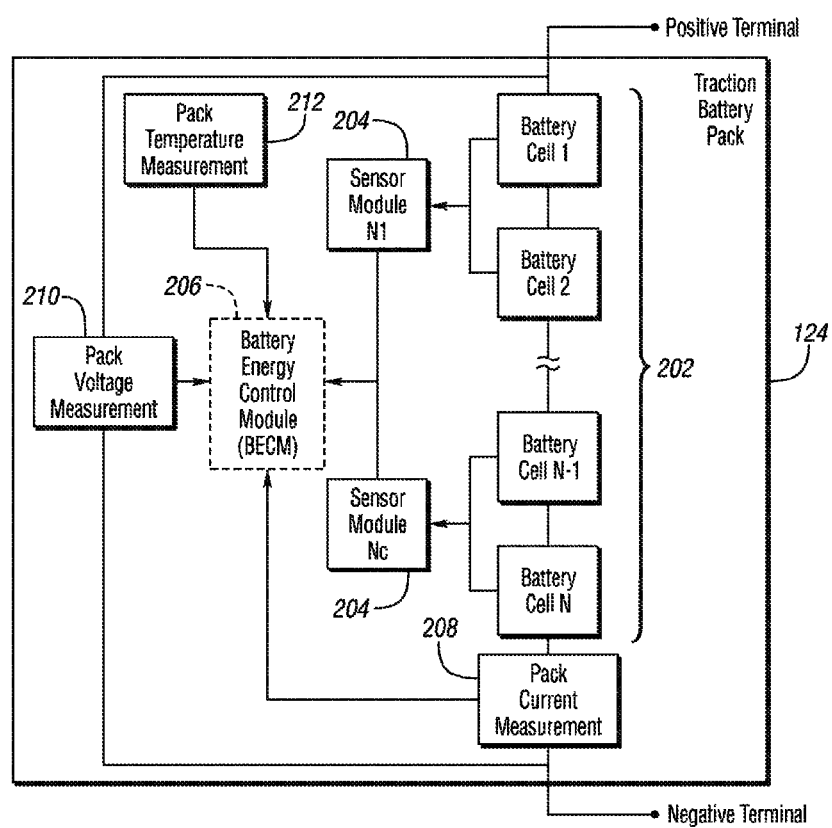
FIG. 2 is a diagram of a possible battery pack arrangement comprised of multiple cells, and monitored and controlled by a Battery Energy Control Module.

The traction battery 124 may be constructed from a variety of chemical formulations. Typical battery pack chemistries may be lead acid, nickel-metal hydride (NIMH) or Lithium-Ion. FIG. 2 shows the traction battery pack 124 as a simple series configuration of N battery cells 202. The traction battery 124, however, may be composed of any number of individual battery cells connected in series or parallel or some combination thereof. A vehicle battery management system may have one or more controllers, such as a Battery Energy Control Module (BECM) 206, that monitor and control the performance of the traction battery 124. The traction battery 124 may include sensors to measure various pack level characteristics. The traction battery 124 may include one or more pack current measurement sensors 208, pack voltage measurement sensors 210, and pack temperature measurement sensors 212. The BECM 206 may include circuitry to interface with the pack current sensors 208, the pack voltage sensors 210 and the pack temperature sensors 212. The BECM 206 may have non-volatile memory such that data may be retained when the BECM 206 is in an off condition. Retained data may be available upon the next key cycle.

In addition to the pack level characteristics, there may be battery cell 202 level characteristics that are measured and monitored. For example, the terminal voltage, current, and temperature of each cell 202 may be measured. A system may use one or more sensor modules 204 to measure the battery cell 202 characteristics. Depending on the capabilities, the sensor modules 204 may measure the characteristics of one or multiple of the battery cells 202. The traction battery 224 may utilize up to N, sensor modules 204 to measure the characteristics of all the battery cells 202. Each of the sensor modules 204 may transfer the measurements to the BECM 206 for further processing and coordination. The sensor modules 204 may transfer signals in analog or digital form to the BECM 206. In some configurations, the functionality of the sensor modules 204 may be incorporated internally to the BECM 206. That is, the hardware of the sensor modules 204 may be integrated as part of the circuitry in the BECM 206 and the BECM 206 may handle the processing of raw signals. The BECM 206 may also include circuitry to interface with the one or more contactors 142 to open and close the contactors 142.

It may be useful to calculate various characteristics of the battery pack. Quantities such as battery power capability, battery capacity, and battery state of charge may be useful for controlling the operation of the traction battery 124 as well as any electrical loads receiving power from the traction battery 124. Battery power capability is a measure of the maximum amount of power the traction battery 124 can provide or the maximum amount of power that the traction battery 124 can receive. Knowing the battery power capability allows the electrical loads to be managed such that the power requested is within limits that the traction battery 124 can handle.

Battery capacity is a measure of a total amount of energy that may be stored in the traction battery 124. The battery capacity (often represented by variable Q) may be expressed in units of Amp-hours. Values related to the battery capacity may be referred to as Amp-hour values. The battery capacity of the traction battery 124 may decrease over the life of the traction battery 124. The traction battery 124 may be characterized by a maximum battery capacity that represents the battery capacity when fully charged (e.g., capacity at 100% state of charge). The traction battery 124 may be characterized by a present or instantaneous battery capacity that represents the battery capacity that is utilized at a present instance of time.

State of charge (SOC) gives an indication of how much charge remains in the traction battery 124. The SOC may be expressed as a percentage of the total possible charge remaining in the traction battery 124. When the SOC is at one hundred percent, the traction battery 124 may be charged to the battery capacity. The SOC value may be output to inform the driver of how much charge remains in the traction battery 124, similar to a fuel gauge. The SOC may also be used to control the operation of an electric or hybrid-electric vehicle. Calculation of SOC can be accomplished by a variety of methods. One possible method of calculating SOC is to perform an integration of the traction battery current over time. This is well-known in the art as ampere-hour integration.

The vehicle battery management system may be configured to operate the traction battery 124 to manage the state of charge of the traction battery 124. The traction battery 124 may be charged or discharged according to a target state of charge compared to a present state of charge. For example, when the present state of charge is greater than the target state of charge, the traction battery 124 may be discharged. Operation of the traction battery 124 may be achieved by commanding a torque of the electric machines 114 to draw current from or provide current to the traction battery 124. Operation of the traction battery 124 may further involve commanding operation of the engine 118 to provide power to the electric machines 114 to charge the traction battery 124.

Several methods may be used to estimate the SOC of the battery cells and/or traction battery. A typical method is Coulomb counting or Amp-hour integration. Using the Coulomb counting approach, the SOC is estimated as:

$$SOC_k = SOC_{k,0} + \frac{\int i \, dt}{c_k} \quad (1)$$

where $SOC_{k,0}$ is an initial SOC value of the $k^{th}$ battery cell at an initial time, $C_k$ is a maximum capacity of the $k^{th}$ battery cell, and i is a current flowing through the battery cell. The maximum capacity of the battery cells may change as the battery ages and the controller 206 may include algorithms to estimate the maximum capacity over the life of the battery.

The initial SOC value, $SOC_{k,0}$, determines the starting value for the Amp-hour integration. As such, it is desired to start the integration process at an accurate value. It is readily observed that any inaccuracy in the starting value will carry through the entire process. Therefore, an accurate estimation or measurement of the initial SOC value is desired.

Figure 3:
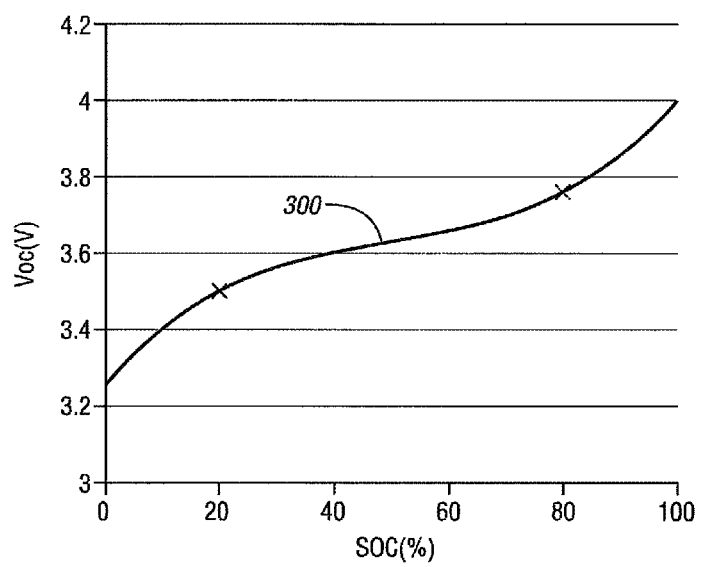
FIG. 3 is a graph depicting a possible relationship between batter open-circuit voltage and battery state of charge.

For a lithium-ion battery cell, the initial SOC value is typically estimated based on an open-circuit voltage (OCV) measurement before the battery cell is coupled to a load. After a rest period, a terminal voltage of the battery cell and the open-circuit voltage will be equivalent under no-load conditions. There exists a relationship between the SOC and the open-circuit voltage of the battery cell. A possible relationship is depicted in FIG. 3 as a characteristic curve 300 relating the SOC to the open-circuit voltage ($V_{oc}$, or OCV). The characteristic curve 300 may be acquired during battery cell testing and may be translated to a table for storage in non-volatile memory of the BECM 206. The initial SOC may be determined by measuring the terminal voltage of the battery cell and setting the initial SOC to the SOC value from the characteristic curve 300 corresponding to the measured voltage value.

Such a procedure generally works effectively for deriving the initial SOC value. However, under some conditions, the voltage measurement may be inaccurate or unavailable. For example, the voltage measurement circuit may have a disconnected conductor or a resistance value may be inaccurate. Further, signal noise may be present which may render the voltage measurement inaccurate. An inaccurate voltage measurement value may lead to an inaccurate initial SOC value.

The voltage sensing circuit may experience an error condition. The error condition may be an out-of-range error. The voltage signal may be designed to operate within a predetermined range of voltages. An out-of-range error may occur when the voltage signal falls outside of the predetermined range of voltages. For example, the voltage signal may be shorted to ground or to a circuit reference voltage. The predetermined range is generally configured to identify these shorted conditions. Other error conditions may include irregularities due to analog-to-digital (A/D) converter errors and loss of communication. For example, in some configurations, the voltage measurements may be received from sensor modules via a communication link. Any loss of communication on the communication link results in a loss of timely voltage measurements.

Under some conditions, a voltage measurement error may be present even though it may not be detectable by the out-of-range error detection logic. The voltage measurement may be within the predetermined range but still be inaccurate for a variety of reasons. A model-based method may be used to diagnose the voltage sensor measurement circuits for in-range sensor errors. The BECM 206 may be programmed with a battery cell model that predicts the battery cell voltage. The model battery voltage may be compared to a measured battery cell voltage. If the model voltage and the measured voltage deviate from one another by more than a predetermined amount, an in-range sensor error may be detected. When an in-range sensor error is detected, the associated battery cell voltage measurement may be excluded from further use in the battery control strategy.

When voltage sensor circuit experiences an error condition, the voltage measurement for the associated battery cell may no longer be available. However, the battery cell may still be capable of functioning properly. As such, it may be useful to estimate the SOC of the battery cell by alternative means in a presence of voltage measurement errors.

A normal voltage sensor measurement may follow a Gaussian distribution prior to contactor closing. There is a low probability that the voltage sensor may output a relatively high or low value that diverges significantly from the true voltage value. Samples taken over a period of time when the battery is in a rest state may vary. That is, due to noise and measurement errors, the voltage measurement value may change values within an expected range of values. In some cases, the voltage sensor may have an offset. The offset is a constant value that is always present in the measurement. The offset may be difficult to estimate as there may be no reference signal available to compare with.

The battery cells 202 are connected in parallel, series or some combination thereof. Within the traction battery 124, the battery cells 202 are generally composed of the same chemistry (e.g., Lithium-ion). The battery cells 202 are generally exposed to the same environmental conditions (e.g., temperature and humidity). The battery cells 202 generally operate under a similar load. Further, battery cells 202 are generally designed to have consistent properties such as self-discharge and characteristic curves. Under similar conditions, the battery cells 202 may be expected to operate in a similar manner. As such, when a battery cell voltage measurement is significantly different than other battery cell voltage measurements, a voltage sensor error may be suspected.

The BECM 206 may be programmed to detect an abnormal cell voltage among the battery cell voltage measurements. At system power up before closing the contactors 142 (e.g., there is no load connected to the traction battery 124), the SOC of the $i^{th}$ cell, $SOC_{i,OCV}$, can be derived based on the open-circuit voltage measurement, if available. After the contactors 142 are closed, the battery cell SOC is primarily calculated based on the Amp-hour integration. Battery cell SOC values may be saved in non-volatile memory at system power down and represent the SOC values at the end of the previous power cycle. The SOC at the end of the last driving cycle may be denoted as $SOC_{i,LAST}$. The voltage-estimated SOC value, $SOC_{OCV}$, at the start of a power cycle may differ from stored SOC values, $SOC_{i,LAST}$, due to the existence of Amp-hour integration errors, voltage measurement errors, and battery self-discharge. A difference value, $SOC_{i,delta}$, may be defined as a difference between $SOC_{i,OCV}$ and $SOC_{i,LAST}$ as follows:

$$SOC_{i,delta} = SOC_{i,OCV} - SOC_{i,LAST}; \; i=1,2,\ldots N \quad (2)$$

This represents the difference between the voltage-estimated SOC at the start of the present battery power cycle and the SOC from the end of the previous power cycle. A corresponding Amp-hour integration error or Amp-hour change may be computed as:

$$AH_{i,error} = SOC_{i,delta} C_i; \; i=1,2,\ldots N \quad (3)$$

It may be expected that that the Amp-hour integration error for each of the cells is similar as the cells are constructed of the same battery chemistry and working in the same environment. The Amp-hour value helps to normalize the values with respect to battery capacity, which may vary slightly for each of the cells. The Amp-hour change represents a change in the amount of charge stored in the battery cells over a duration between consecutive power cycles.

A mean value of the Amp-hour integration errors or changes may be computed as:

$$AH_{mean\;error} = \frac{\sum_{i=1}^{N} AH_{i,error}}{N} \quad (4)$$

and a corresponding standard deviation may be computed as:

$$AH_{std} = \sqrt{\frac{(AH_{i,error} - AH_{mean\;error})^2}{N-1}} \quad (5)$$

Under normal conditions, the Amp-hour integration error for each of the cells is expected to be close to the mean value. An Amp-hour integration error that significantly deviates from the mean may be indicative of an abnormal voltage measurement and/or an abnormal self-discharge loss for the battery cell.

The statistical mean and standard deviation may be used to analyze each of the battery cells. If the Amp-hour change over the duration associated with a battery cell differs from the mean Amp-hour change over the duration by greater than a predetermined amount, than a voltage sensor error may be present. The Amp-hour integration error may be analyzed to determine if the value falls into one of the following ranges:

$$AH_{i,error} > AH_{mean\;error} + K^* AH_{std} \quad (6)$$

$$AH_{mean\;error} - K^* AH_{std} \leq AH_{i,error} \leq AH_{mean\;error} + K^* AH_{std} \quad (7)$$

$$AH_{i,error} < AH_{mean\;error} - K^* AH_{std} \quad (8)$$

The Amp-hour integration error is based on an SOC value from the end of an immediately preceding power cycle and a voltage-based SOC value from the start of the present power cycle. The average voltage of the battery cells may decrease during the duration of time between the power cycles due to self-discharge or other leakage current. The average voltage may increase during the duration of time between the power cycles due to relaxation processes of the battery cell. In either case, under normal conditions, the battery cell voltages for each of the cells may be expected to rise or fall in a similar manner. Further, the behavior of the cell voltages may depend on the duration between power cycles.

A voltage sensor error may be present when the magnitude of the Amp-hour integration error exceeds a certain threshold. The threshold may be defined as the mean Amp-hour change over the duration for all of the cells plus a product of a factor and the Amp-hour change standard deviation. The factor, K, may be related to a predetermined confidence level. Such a condition may be detected when the measured voltage of the battery cell is greater than the other battery cell voltages. The condition may be caused by excessive measurement noise or some error in the circuit. In such a condition, an error condition for the voltage sensor may be indicated.

When the Amp-hour change of the battery cell over the duration falls within a predetermined range, it may be inferred that the voltage sensing circuits are functioning properly. As a result, the associated voltage measurements may be deemed to be reliable and may be used for further control strategies.

The mean Amp-hour integration error being positive indicates that the SOC has risen since the last power cycle. Such a result may be due to relaxation process of the battery cells during the time between power cycles. The mean Amp-hour integration error being negative indicates that the SOC has decayed since the last power cycle. A battery cell having an Amp-hour integration error that is a predetermined amount greater than the average Amp-hour change or a predetermined amount less than the average Amp-hour change may be indicative of a voltage measurement error for that battery cell.

When the Amp-hour integration error for a cell is a predetermined amount greater than the mean value, a voltage measurement error may be detected. An Amp-hour integration error for a cell that is a predetermined amount less than the mean value may be indicative of a large self-discharge loss for the cell or a voltage measurement error. As there may be different problem sources, it may be beneficial to develop a method of distinguishing between the error sources. The control system may respond differently to an abnormal cell and a voltage sensing error. By detecting the cause of the error, the control system may respond in an appropriate manner.

If the duration between power cycles is relatively short, the SOC should not decrease significantly. The normal self-discharge rate for a Lithium-ion battery may be approximately 1-2 percent per month. The self-discharge rate may also vary as a function of time, ambient temperature, and age of the battery. For example, the self-discharge rate may increase as SOC increases, temperature increases, and/or battery age increases.

The controller may monitor a duration of time that the battery is between power cycles. A power cycle may begin with an operator starting the vehicle (e.g., ignition-on cycle). The power cycle may also begin at predetermined time intervals (e.g., battery controller wake-up to perform monitoring). The power cycle may also correspond to charging the traction battery 124. A maximum power off time parameter may be defined to determine if the battery relaxation time is short enough to suspect a voltage measurement error.

The duration between power cycles may be compared to a minimum time parameter ($T_{min}$) that is selected to ensure that a sufficient rest time has taken place. If the rest time is not sufficient, the terminal voltage may not accurately reflect the open-circuit voltage. In such case, the SOC derived from the voltage measurements will not be accurate and should not be relied upon. In this case, the SOC may be initialized to the stored SOC value from the immediately preceding power cycle. The minimum time parameter may be selected as an expected amount of time for the terminal voltage of the battery cells to relax to the open-circuit voltage of the battery cells.

The duration between power cycles may be compared to a maximum power off time parameter ($T_{max}$). If the duration between power cycles is less than the maximum power off time parameter, then it is expected that the Amp-hour integration error due to self-discharge is small. A SOC decrease threshold parameter ($K_{soc\ decr}$) may be defined. The product of the SOC decrease threshold parameter and the maximum cell capacity may define a minimum amount of Amp-hour integration deviation from the mean Amp-hour integration error to suspect a voltage measurement error. The controller 206 may infer that the voltage measurement for that cell is in error with a high level of confidence if the following expression is satisfied:

$$AH_{i,error} < AH_{mean\ error} - \max(K^* AH_{std},\ C_i K_{SOC\ decr}) \quad (9)$$

After a relatively short power off cycle, the Amp-hour integration error caused by self-discharge should be quite small. If the conditions stated by equation (9) are satisfied, a voltage measurement error may be established. A diagnostic flag may be set to initiate an alternate operating strategy for the traction battery. In addition, the SOC of the cell may be initialized by an alternative means that does not depend on the voltage measurement.

If the duration between power cycles is greater than the maximum power off time parameter and the Amp-hour integration error condition is satisfied, then it is difficult to ascertain the actual condition causing the Amp-hour integration error. In this case, the cell voltage measurement may be assumed to be correct. The cell voltage measurement may be used to operate the battery cell. This approach is reasonable because it will prevent over-discharge of the battery if there is a significant self-discharge and the battery cell SOC is actually low. In the event that an excessive self-discharge is present, the self-discharge over time will introduce a cell imbalance condition. The cell imbalance condition may be detected and cell balancing may be initiated. For example, other battery cells may be discharged until all of the battery cell voltages are equalized.

When the conditions indicative of a voltage measurement error are satisfied, an alternate operating strategy may be employed for the traction battery. Since the voltage measurement of the affected cell is in error, the voltage measurement cannot be relied on for controlling the battery cell. The issue becomes how to initialize the SOC of the affected battery cell upon initiation of a power cycle.

In an initial determination phase, the logic described above may be performed. For the initial determination phase, the average Amp-hour integration error includes the value for each of the cells. This full-average value is used to determine if a voltage error is present for each of the cells. Each cell having a voltage error may be identified in the initial determination phase. For example, $N_1$ of the cells may be deemed to have a valid voltage measurement, while $N_2$ of the cells may be suspected to have a voltage measurement error.

In an SOC determination phase, the SOC for each of the cells may be determined. The SOC for those $N_1$ cells having a valid voltage measurement may be derived from the voltage measurement. The controller 206 may be programmed to output the state of charge for each of the cells.

The SOC for those $N_2$ cells having a voltage measurement error may be computed based on the average Amp-hour integration error. In some configurations, the average computed in the initial determination phase may be used. In some configurations, it may be desired to recompute the average Amp-hour integration using only those cells with a valid voltage measurement.

For each cell, the SOC error, $SOC_{i,delta}$, may be computed for each of the battery cells. An average Amp-hour integration error for the $N_1$ non-suspect cells may be computed. The average may only include the Amp-hour integration error for those cells not suspected of having a voltage measurement error. Those cells that satisfy the voltage measurement error conditions may be excluded from the average calculation.

$$AH_{mean\ error\ non-suspect} = \frac{\sum_{i=1}^{N_1} SOC_{i,delta} C_i}{N_1} \quad (10)$$

where $N_1$ is the number of battery cells not suspected of having a voltage measurement error. The average includes only those cells that have a valid open-circuit voltage measurement. The SOC for a cell with a suspected voltage measurement error may be estimated as:

$$SOC_{j,OCV} = SOC_{j,last} + \frac{AH_{mean\ error\ non-suspect}}{C_j} \quad (11)$$

where j represents the number, $N_2$, of those battery cells for which a voltage measurement error is suspected. The $SOC_{j, last}$ value is the SOC for the battery cell at the end of the last power cycle.

Figure 4:
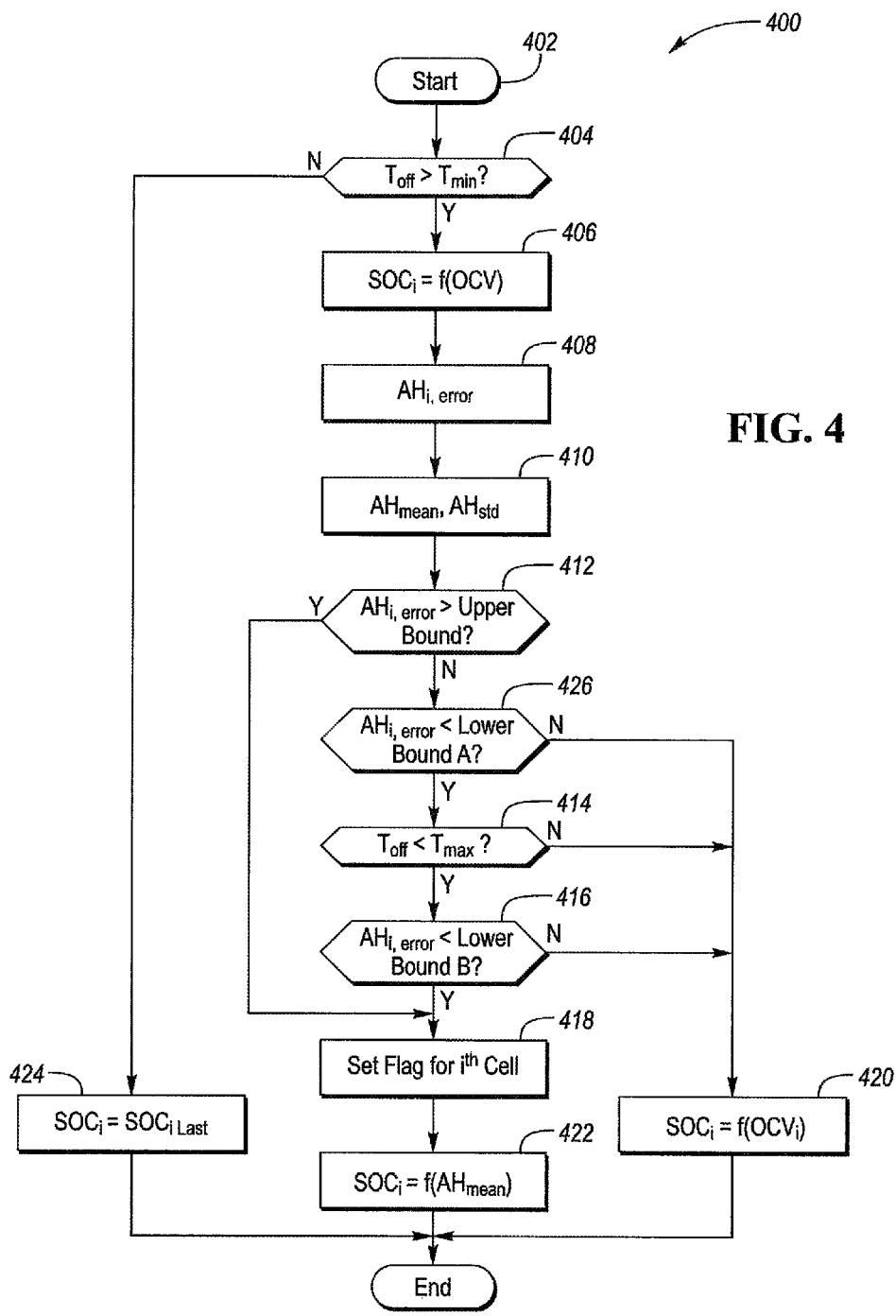
FIG. 4 is a flow chart depicting a possible sequence of operations for estimating a traction battery state of charge.

The system described may be implemented in a controller (e.g., BECM 206). FIG. 4 depicts a flowchart for a possible sequence of operations for implementing the described voltage measurement error detection and SOC initialization method 400 in the controller. Execution may begin at operation 402. At operation 404, the duration between power cycles ($T_{off}$) may be computed and compared to the minimum time parameter ($T_{min}$). If the duration between power cycles is less than or equal to the minimum time parameter, operation 424 may be executed. At operation 424, the SOC for the cell may be initialized to the associated SOC value from the immediately preceding power cycle.

If the duration between power cycles is greater than the minimum time parameter, then operation 406 may be executed. At operation 406, the voltage measurement for each cell may be available and the SOC for each cell may be derived from the voltage measurement. At operation 408, the Amp-hour change over the duration for each cell may be computed using the voltage-based SOC value and the SOC from the end of the last power cycle. At operation 410, the mean Amp-hour change and the standard deviation of the Amp-hour changes may be computed.

At operation 412, the Amp-hour change for each cell may be compared to an upper bound. The upper bound may be defined in part by a product of a predetermined factor and the standard deviation of the Amp-hour change for the cells as described above. If the Amp-hour change for the cell is greater than the upper bound, then operation 418 may be executed. At operation 418, a voltage measurement error flag may be set for the cell. Operation 422 may then be executed to compute the SOC for the cell based on the average Amp-hour change as described above.

If the Amp-hour change for the cell is less than or equal to the upper bound, then operation 426 may be executed. At operation 426, the Amp-hour change for each cell may be compared to a first lower bound. The first lower bound may be defined as in equation (8). If the Amp-hour change is greater than or equal to the first lower bound then operation 420 may be executed. At operation 420, the SOC for the cell is derived from the voltage measurement.

If the Amp-hour change for the cell is less then the first lower bound, then operation 414 may be executed. At operation 414, the duration between power cycles may be compared to the maximum power off time parameter ($T_{max}$). The maximum power off time may be defined as an amount of time at which the Amp-hour change is not expected to be greater than the predetermined amount. If the duration between power cycles is greater than the maximum power off time parameter, then operation 420 may be executed. At operation 420, the SOC for the cell is derived based on the voltage measurement.

If the duration between power cycles is less than or equal to the maximum power off time parameter, then operation 416 may be executed. At operation 416, the Amp-hour change for each cell is compared to a second lower bound. If the Amp-hour change is greater than or equal to the second lower bound, then operation 420 may be executed. The second lower bound may be defined as in equation (9). At operation 420, the SOC for the cell is derived from the voltage measurement.

If the Amp-hour change for the cell is less than the second lower bound, then operation 418 may be executed. At operation 418, a voltage measurement error flag may be set for the cell. The controller 206 may also output a diagnostic indicator associated with those battery cells that are suspected of having a voltage measurement error. Operation 422 may then be executed to compute the SOC for the cell based on the average Amp-hour change as described above.

After the SOC is computed for each of the cells, the traction battery may be operated according the SOC values. The initialized value may be the starting value for the Amp-hour integration during the power cycle. The described technique for initializing the SOC for the battery cells allows for accurate monitoring of the SOC in the presence of voltage measurement errors. Further, voltage measurement errors may be identified by the described procedures. The result is more accurate control of the traction battery.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A vehicle comprising:
a battery including a plurality of cells; and
a controller programmed to, in response to a duration between consecutive power cycles being within a predetermined range and an Amp-hour change of one of the cells over the duration being a predetermined amount less than an average Amp-hour change of the cells over the duration, output a state of charge for the one of the cells based on the average Amp-hour change.

2. The vehicle of claim 1 wherein the controller is further programmed to, in response to the Amp-hour change being a second predetermined amount greater than the average Amp-hour change, output the state of charge for the one of the cells based on the average Amp-hour change.

3. The vehicle of claim 2 wherein the controller is further programmed to, in response to the Amp-hour change being within a range, including the predetermined amount and the second predetermined amount, of the average Amp-hour change, output the state of charge for the one of the cells based on a cell voltage measured during a present power cycle.

4. The vehicle of claim 1 wherein the controller is further programmed to estimate a standard deviation of the Amp-hour change over all of the cells and wherein the predetermined amount is based on the standard deviation.

5. The vehicle of claim 4 wherein the predetermined amount is at least a predetermined maximum amount of change.

6. The vehicle of claim 1 wherein the predetermined range includes a minimum value that is an expected amount of time for a terminal voltage of the cells to relax to an open-circuit voltage of the cells.

7. The vehicle of claim 1 wherein the predetermined range includes a maximum value that is an amount of time at which the Amp-hour change is not expected to be greater than the predetermined amount.

8. The vehicle of claim 1 wherein the controller is further programmed to, in response to the duration between power cycles being less than a minimum duration, output the state of charge for the one of the cells based on a previous state of charge from an immediately preceding power cycle.

9. The vehicle of claim 1 wherein the controller is further programmed to output the state of charge for the one of the cells based on a previous state of charge from an immediately preceding power cycle and a maximum capacity of the one of the cells.

10. The vehicle of claim 1 wherein the controller is further programmed to, in response to outputting the state of charge for the one of the cells based on the average Amp-hour change, output a diagnostic indicator associated with the cell indicative of a voltage measurement error.

11. A battery management system comprising:
a controller programmed to, in response to a duration between consecutive power cycles being greater than a predetermined duration and an Amp-hour change of one of a plurality of battery cells over the duration being a predetermined amount greater than an average Amp-hour change of the battery cells over the duration, output a state of charge for the one of the battery cells based on the average Amp-hour change.

12. The battery management system of claim 11 wherein the controller is further programmed to, in response to the Amp-hour change of the one of the battery cells being within a predetermined range about the average Amp-hour change, output the state of charge based on a measured battery cell voltage during a present power cycle.

13. The battery management system of claim 12 wherein the controller is further programmed to generate the average Amp-hour change based on the battery cells that output the state of charge based on the measured cell voltage.

14. The battery management system of claim 11 wherein the controller is further programmed to estimate a standard deviation of Amp-hour change of the battery cells and wherein the predetermined amount is based on a standard deviation of the Amp-hour change of the battery cells.

15. The battery management system of claim 11 wherein the controller is further programmed to, in response to the Amp-hour change being a second predetermined amount less than the average Amp-hour change and the duration being within a predetermined range, output the state of charge for the one of the battery cells based on the average Amp-hour change.

16. A method comprising:
outputting by a controller a state of charge for one of a plurality of battery cells based on an average Amp-hour change over a duration between power cycles in response to the duration being within a predetermined range and an Amp-hour change of one of the battery cells over the duration being a predetermined amount less than the average Amp-hour change.

17. The method of claim 16 further comprising outputting by the controller the state of charge for the one of the battery cells based on the average Amp-hour change in response to the Amp-hour change being a second predetermined amount greater than the average Amp-hour change.

18. The method of claim 17 further comprising outputting by the controller the state of charge for the one of the battery cells based on a measured voltage associated with the one of the battery cells in response to the Amp-hour change being within a range, defined by the predetermined amount and the second predetermined amount, about the average Amp-hour change.

19. The method of claim 16 further comprising outputting by the controller the state of charge for the one of the battery cells based on a previous state of charge value from an immediately preceding power cycle in response to the duration being less than a minimum value of the predetermined range.

* * * * *